April 5, 1966 D. J. GREENING ET AL 3,244,964

AMPLIFIER SYSTEMS

Filed Feb. 8, 1962 3 Sheets-Sheet 1

Inventors
Donald J. Greening
Stanley O. Gregory
By Wm. A. [signature]
Attorney

April 5, 1966 D. J. GREENING ET AL 3,244,964

AMPLIFIER SYSTEMS

Filed Feb. 8, 1962 3 Sheets-Sheet 2

April 5, 1966 D. J. GREENING ET AL 3,244,964

AMPLIFIER SYSTEMS

Filed Feb. 8, 1962 3 Sheets-Sheet 3

United States Patent Office 3,244,964
Patented Apr. 5, 1966

3,244,964

AMPLIFIER SYSTEMS

Donald J. Greening, Thiensville, and Stanley O. Gregory, Milwaukee, Wis., assignors to Cutler-Hammer, Inc., Milwaukee, Wis., a corporation of Delaware Filed Feb. 8, 1962, Ser. No. 171,848
23 Claims. (Cl. 323—22)

This invention relates to amplifier systems. More particularly, the invention relates to amplifier systems employing gating-type power controlling devices and affording a linear output voltage to input voltage relationship which is substantially unaffected by the wave form of the supply voltage applied to such power controlling device.

While not limited thereto, the invention is especially applicable to control of an alternating current load device in response to an adjustable direct current input signal.

An object of the invention is to provide improved amplifier systems.

A more specific object of the invention is to provide improved means affording a linear output voltage to input voltage relationship.

Another specific object of the invention is to provide improved amplifier systems affording an output voltage which is linearly proportional to an adjustable input voltage and which linearity is not affected by different wave forms of the supply voltage applied thereto.

Another specific object of the invention is to provide improved amplifier systems for operating an alternating current load device in response to a unidirectional input control signal which are simple in construction and effective in operation and wherein the requirements for the alternating current to direct current conversion component parameters are less stringent, this being accomplished at least in part by amplifying a unidirectional input signal and for converting such amplified signal at high power level to an alternating current output signal.

Another specific object of the invention is to provide improved amplifier systems employing gating-type power controlling devices and improved means for controlling the latter.

Another object of the invention is to provide improved firing control circuits for gating-type power controlling devices.

Another object of the invention is to provide improved means for controlling a gating-type power controlling device with one or more signals proportional to the integrated volt-seconds appearing across such device.

Another object of the invention is to provide improved means for controlling a gating-type power controlling device wherein an input control signal sets the point at which the device is fired by the aforementioned integrated signal.

A further object of the invention is to provide improved means for controlling a gating-type power controlling device wherein such device is fired when the algebraic sum of a control signal and the integrated voltage across such device reaches a fixed value.

Other objects and advantages of the invention will hereinafter appear.

The aforementioned and other objects and advantages of the invention and the manner of obtaining them will best be understood by reference to the following description of embodiments of amplifier systems taken in conjunction with the accompanying drawings, wherein.

Figure 6A:
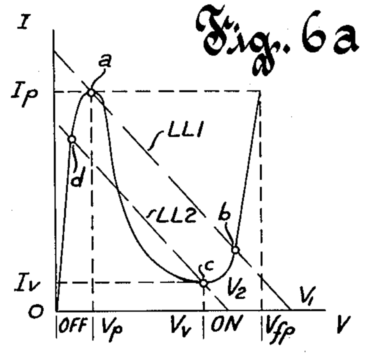
Figure 3:
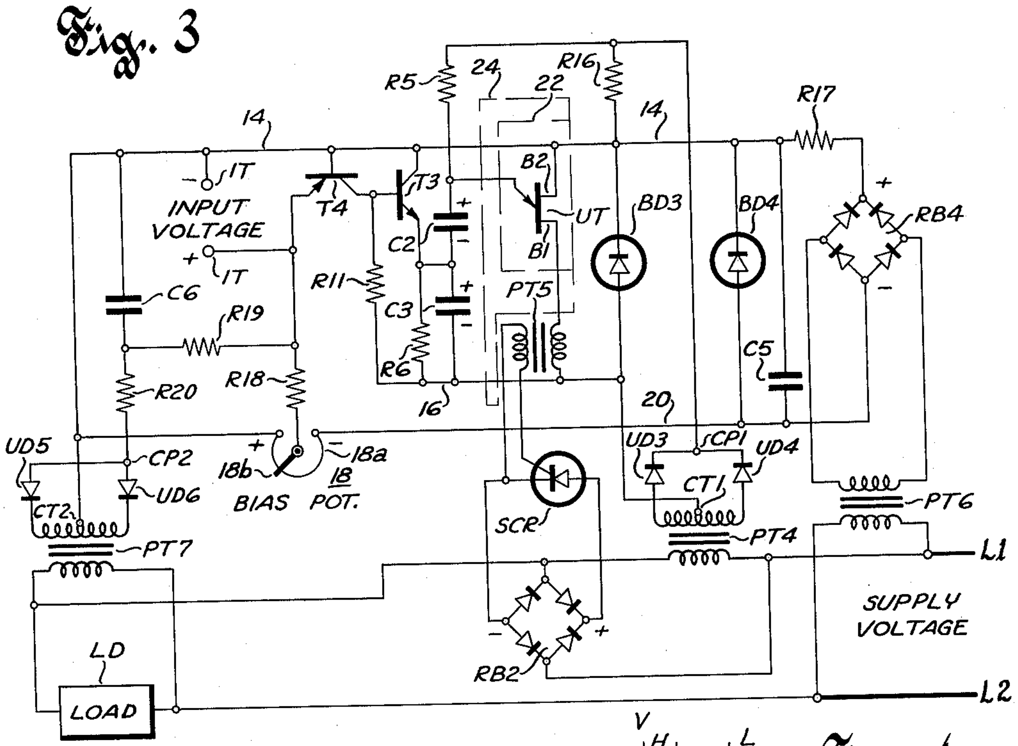
FIG. 3 is a diagrammatic illustration of a second modification of the invention.
Figure 4:
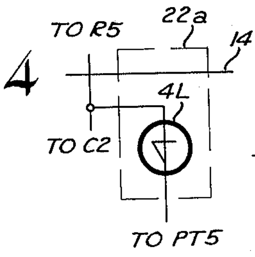
FIG. 4 is a diagrammatic illustration of a circuit which may be substituted in FIG. 3 to form a third modification of the invention.
Figure 4A:
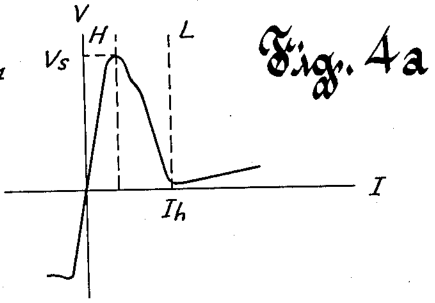
Figure 5:
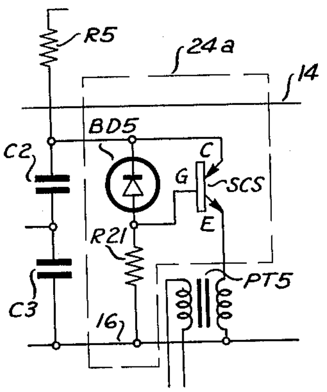
Figure 7:
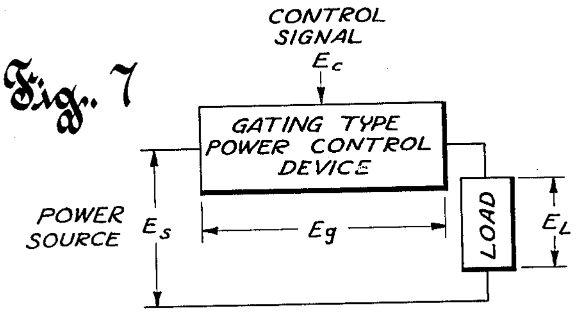
Figure 6:
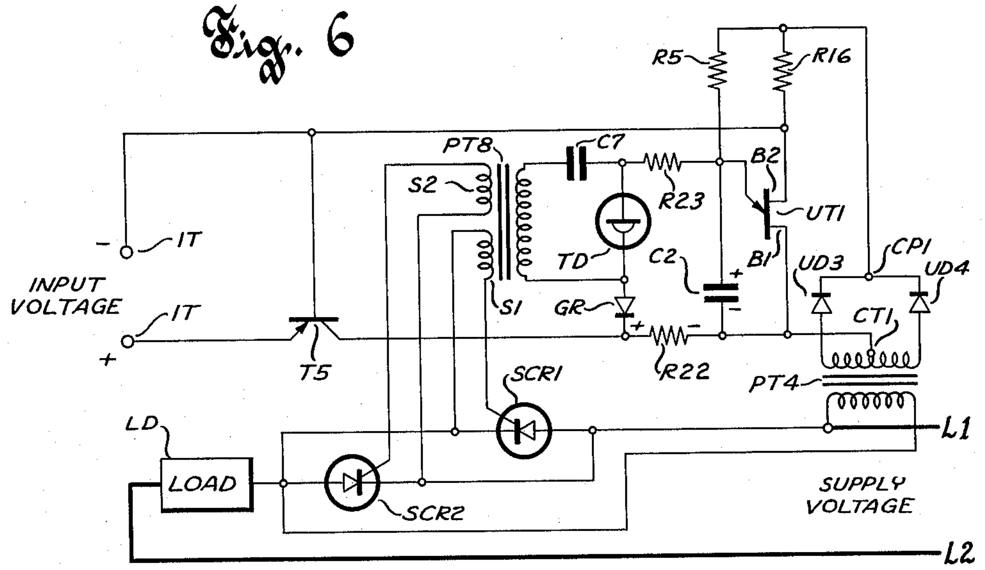
Figure 8:
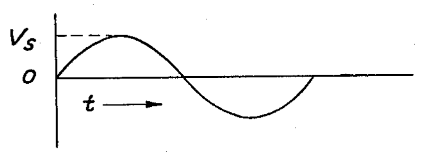
Figure 9:
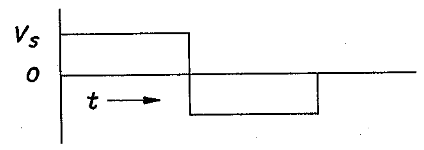
Figure 10:
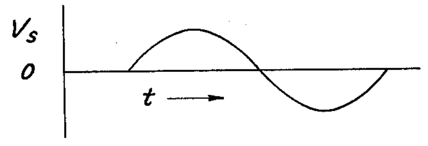

FIG. 4*a* is a graphical illustration of operating characteristics of the circuit of FIG. 4;

FIG. 5 is a diagrammatic illustration of a circuit which may be substituted in FIG. 3 to form a fourth modification of the invention;

FIG. 6 is a diagrammatic illustration of a system forming fifth modification of the invention;

FIG. 6*a* is a graphical illustration of operating characteristics of the system of FIG. 6;

FIG. 7 is a schematic illustration of the invention showing certain voltages referred to in the specification;

FIGS. 8, 9 and 10 show voltage wave forms of the invention; and

Figure 11:
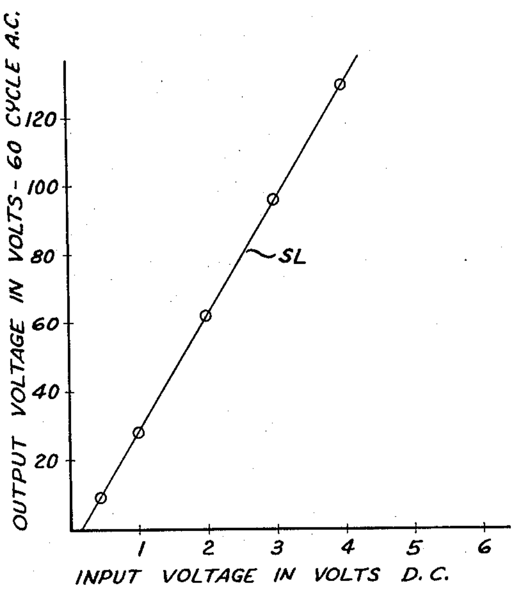

FIG. 11 is a graphic illustration of the output voltage to input voltage relationship and its linearity.

Figure 1:
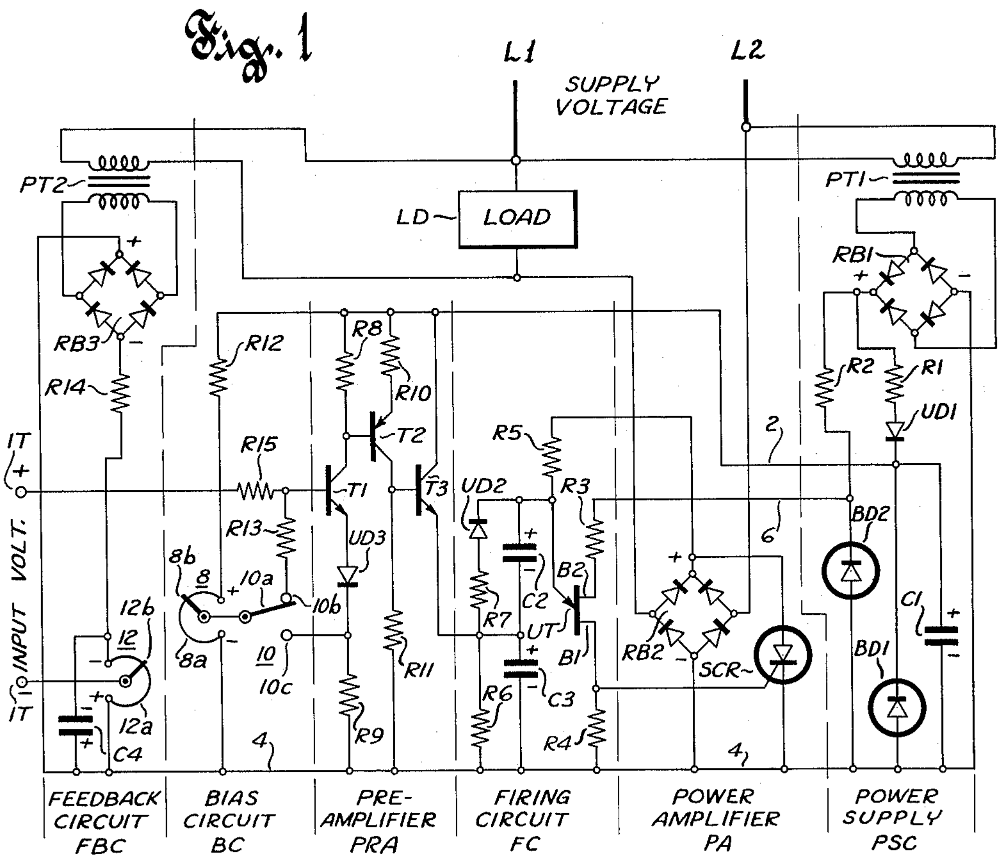
FIGURE 1 is a diagrammatic illustration of an amplifier system constructed in accordance with the invention.

Referring to FIG. 1, there is shown an amplifier system for operating a load device LD. The system is supplied with electrical voltage from an alternating current power supply source through supply lines L1 and L2 and is controlled by a unidirectional input voltage connected to positive and negative input terminals IT. The system comprises a power supply circuit PSC, a bias circuit BC, a preamplifier circuit PRA, a firing circuit FC, a power amplifier circuit PA and a feedback circuit FBC.

Power supply circuit PSC comprises means for supplying voltages to the bias, the preamplifier and the firing circuits. This means comprises a transformer PT1 having its primary winding connected across lines L1 and L2 and its secondary winding connected to the input terminals of a full-wave rectifier bridge RB1. The positive output terminal of bridge RB1 is connected through a resistor R1 and a unidirectional diode UD1 to conductor 2 and the negative output terminal of bridge RB1 is connected directly to conductor 4. A breakdown diode BD1 of the Zener type or the like is connected across conductors 2 and 4 to limit the maximum voltage across these conductors. A capacitor C1 is connected across conductors 2 and 4 in parallel with diode BD1 to smooth the rectified voltage appearing across these conductors. The positive terminal of rectifier bridge RB1 is also connected through a resistor R2 to conductor 6. A breakdown diode BD2 of the Zener type or the like is connected across conductors 6 and 4 to limit the maximum voltage across these conductors.

Power amplifier circuit PA comprises means for controlling the alternating current power to the load device. This means comprises a full-wave rectifier bridge RB2 and a gating-type power controlling device of the semiconductor type such as a silicon controlled rectifier SCR. Line L1 is connected through load device LD to one input terminal of bridge RB2 and line L2 is connected directly to the other input terminal of bridge RB2. The positive output terminal of bridge RB2 is connected through the anode and cathode of silicon controlled rectifier SCR in that order to conductor 4 and the latter is connected directly to the negative output terminal of bridge RB2.

Firing circuit FC comprises means for controlling the power amplifier. This means comprises a unijunction transistor UT having a negative resistance region in its voltage-current characteristic and having its second base B2 connected through a resistor R3 to conductor 6 and its first base B1 connected through a resistor R4 to conductor 4. The junction of base B1 and resistor R4 is connected directly to the gate of silicon controlled rectifier SCR. The emitter of unijunction transistor UT is connected through a resistor R5 to the positive output terminal of rectifier bridge RB2. The emitter of the unijunction transistor is also connected through capacitors C2 and C3 in series to conductor 4. A resistor R6 is connected across capacitor C3. A resistor R7 and a unidirectionally conducting diode UD2 are connected in series in that order from the junction of capacitors C2 and C3 to the other side of capacitor C2. Diode UD2 is poled to prevent capacitor C2 from charging in the reverse direction from that indicated by the positive and negative symbols.

Preamplifier circuit PRA comprises means for amplifying the input signal to charge capacitor C3. This means consists of three preamplifier stages comprising transistors T1, T2 and T3. Transistors T1 and T3 are of N-P-N conductivity type and transistor T2 is of the P-N-P conductivity type. Conductor 2 is connected through a resistor R8, the collector and emitter of transistor T1, a unidirectional diode UD3 and a resistor R9 in series to conductor 4. Conductor 2 is also connected through a resistor R10, the emitter and collector of transistor T2 and a resistor R11 in series to conductor 4. Conductor 2 is further connected through the collector and emitter of transistor T3 to the junction of resistors R6 and R7 in firing circuit FC. The collector of transistor T1 is connected directly to the base of transistor T2 and the collector of transistor T2 is connected directly to the base of transistor T3.

Bias circuit BC comprises means for applying a bias voltage to the first preamplifier stage to establish a selected operating condition from which it is controlled by the input signal. This means comprises a potentiometer 8 having its resistor *8a* connected in series with a resistor R12 in that order between conductors 4 and 2. Movable tap *8b* of potentiometer 8 is connected to the movable contact 10*a* of a switch 10. A first stationary contact 10*b* of switch 10 is connected through a resistor R13 to the base of transistor T1. A second stationary contact 10*c* of switch 10 is connected to the junction of diode UD3 and resistor R9 in the first stage of preamplifier circuit PRA.

Feedback circuit FBC comprises means for feeding back a voltage proportional to the voltage appearing across the load device and for applying this voltage in opposition to the input signal voltage as "negative" feedback to stabilize the amplifier operation. This means comprises a transformer PT2 having its primary winding connected across load device LD and having its secondary winding connected to the input terminals of a full-wave rectifier bridge RB3. The positive output terminal of bridge RB3 is connected directly to conductor 4 and the negative output terminal of the bridge is connected through a resistor R14 in series with a resistor 12*a* of a potentiometer 12 to conductor 4. A capacitor C4 is connected across potentiometer resistor 12*a* to smooth the rectified alternating current.

The input voltage appearing at input terminals IT is applied across the base-emitter junction of the preamplifier first stage transistor T1. To this end, the positive input terminal is connected through a current limiting resistor R15 to the base of transistor T1 and the negative input terminal is connected directly to movable tap 12*b* of potentiometer 12.

As will be apparent, power supply circuit PSC applies a first full-wave rectified voltage across conductors 2 and 4 to supply the main conduction paths of preamplifier transistors T1, T2 and T3. This first supply voltage is regulated or maintained constant by breakover diode BD1 so as not to exceed a predetermined value and is smoothed by capacitor C1. The power supply circuit applies a second full-wave rectified voltage across conductors 6 and 4 to supply the base B2 to base B1 voltage for unijunction transistor UT. This second supply voltage is regulated or maintained constant by breakover diode BD2 so as not to exceed a predetermined value. Unidirectional diode UD1 is provided to isolate the aforementioned two supply voltages from one another. That is, diode UD1 is in the nature of a blocking diode and is poled to prevent current flow from capacitor C1 therethrough and through resistors R1 and R2 to conductor 6. Thus, the pulsating positive voltage on conductor 6 is isolated from the constant positive voltage on conductor 2 although both of these voltages are derived from the same rectifier bridge RB1.

The operation of the system of FIG. 1 will now be described. Current flows from conductor 2 through resistor R12 and resistor *8a* of potentiometer 8 to conductor 4. When movable contact 10*a* of switch 10 is in engagement with stationary contact 10*b* as shown in FIG. 1, an adjustable portion of the voltage appearing across resistor *8a* of the potentiometer is applied from movable tap *8b* thereof through contacts 10*a* and 10*b* of switch 10 and current limiting resistor R13 to the base of transistor T1. It will be apparent that the negative side of this adjustable bias voltage is connected through conductor 4, resistor R9 and diode UD3 to the emitter of transistor T1. This bias voltage may be adjusted by moving tap *8b* to bias transistor T1 to its "on" condition a desired amount to establish a selected operating point for the transistor from which its conduction may be increased by an input signal voltage having the polarity shown by the positive and negative symbols adjacent input terminals IT. On the other hand, an input signal voltage of the opposite polarity may be applied to decrease the conduction of transistor T1 from the aforementioned operating point to which it is biased.

When contact 10*a* of switch 10 is moved into engagement with stationary contact 10*c*, the voltage appearing across the lower portion of potentiometer resistor *8a* is applied to the junction of diode UD3 and resistor R9. Application of such bias voltage to the lower side of diode UD3 causes the latter to be blocked or reverse biased to prevent current flow in the collector-emitter junction of transistor T1 until an input voltage of the polarity indicated in FIG. 1 and of a magnitude to overcome such blocking voltage is applied.

For exemplary purposes, let it be assumed that switch 10 is positioned as shown in FIG. 1 and that the resultant bias voltage renders transistor T1 conducting a small amount as a reference operating point from which its conduction is controlled by an input signal voltage. Application of an input signal voltage to terminals IT having a polarity such that the upper input terminal is positive and the lower input terminal is negative causes operation of the preamplifier. To this end, current flows from conductor 2 through resistor R8, the collector-emitter junction of transistor T1, diode UD3 in its forward low impedance direction and resistor R9 to conductor 4.

Current flow through resistor R8 causes transistor T2 to be rendered conducting. To this end, the voltage drop across resistor R8 shifts the base of transistor T2 negative relative to the emitter thereof to cause transistor T2 to conduct. Current flows from conductor 2 through resistor R10, the emitter-collector junction of transistor T2 and resistor R11 to conductor 4.

Current flow through resistor R11 causes transistor T3 to be rendered conducting. To this end, the voltage drop across resistor R11 shifts the base voltage of transistor T3 positive relative to the emitter voltage thereof to cause transistor T3 to conduct. Current flows from conductor 2 through the collector-emitter junction of transistor T3 and capacitor C3 to conductor 4. Capacitor C3 charges in response to the current flow through transistor T3 to the polarity shown in FIG. 1 and diverts the current through resistor R6 until the capacitor voltage equals the voltage drop across resistor R6.

The positive voltage on conductor 6 is applied through current limiting resistor R3 to base B2 of unijunction transistor UT. The rectified alternating voltage appearing across silicon controlled rectifier SCR causes current flow through resistor R5, capacitor C2 and resistor R6 to conductor 4. As a result, capacitor C2 charges on each rectified half-cycle of the voltage to the polarity shown in FIG. 1. The voltage across capacitor C2 is added to the voltage across capacitor C3 since these capacitors are connected in series and the sum of these voltages is applied across the emitter-base B1 junction of unijunction transistor UT. When the sum of these voltages reaches a predetermined value on each half-cycle of the rectified voltage appearing across gate-controlled device SCR, unijunction transistor UT is rendered conducting. As a result, capacitor C2 discharges through the emitter-base B1 junction of unijunction transistor UT, resistor R4 and capacitor C3. Capacitor C3 makes the discharge path of capacitor C2 of low impedance to pulses. Resistor R7 and diode UD2 provide a discharge path for any reverse charge on capacitor C2 and thereby prevent capacitor C2 from charging in the reverse direction which might otherwise occur following discharge of capacitor C2 through the unijunction transistor because of the voltage across capacitor C3.

When capacitor C2 discharges through the unijunction transistor and resistor R4 as aforementioned, the pulse of current through resistor R4 causes a voltage pulse to appear thereacross. This voltage pulse is applied through conductor 4 across the gate and cathode of device SCR to render device SCR conducting in its anode-cathode junction. The silicon controlled rectifier SCR has an operating characteristic similar to a gas thyratron. That is, the gate voltage pulse triggers the silicon controlled rectifier to start conduction thereof. After the gate pulse is applied, the silicon controlled rectifier conducts in the forward or anode-to-cathode direction and will continue to conduct even after the gate pulse decreases or terminates until the anode-to-cathode voltage thereof is decreased. In this manner, device SCR will conduct following triggering thereof for the remainder of each rectified half-cycle of the supply voltage. As a result, during each such half-cycle that device SCR conducts, current flows from line L1 through load device LD, the left-hand input terminal and the positive output terminal of rectifier bridge RB2, device SCR, conductor 4, the negative output terminal and the right-hand input terminal of bridge RB2 to line L2. On each alternate half-cycle of the alternating supply voltage, current flows from line L2 through the right-hand input terminal and the positive output terminal of bridge RB2, device SCR, conductor 4, the negative output terminal and the left-hand input terminal of bridge RB2 and load device LD to line L1. As a result, load device LD is energized with alternating current the magnitude of which is controlled by device SCR.

A negative feedback voltage is applied from across load device LD through transformer PT2 to the input terminals of rectifier bridge RB3. As a result, on each rectified half-cycle of the voltage across the load, current flows from the positive output terminal of bridge RB3 through conductor 4, resistor 12*a* of potentiometer 12 and resistor R14 to the negative output terminal of bridge RB3. Due to such current flow, a voltage is developed across potentiometer resistor 12*a*. This unidirectional voltage across resistor 12*a* is smoothed by capacitor C4. An adjustable portion of this voltage appearing across the lower portion of potentiometer resistor 12*a* is applied in opposition to the input signal voltage as negative feedback. As will be apparent, the feedback voltage opposes the input signal voltage in the circuit extending from the positive input terminal IT through resistor R15, the base-emitter junction of transistor T1, diode UD3, resistor R9, conductor 4, and the lower portion of resistor 12*a* and movable tap 12*b* of potentiometer 12 to the negative input terminal. The magnitude of the feedback voltage may be adjusted by moving tap 12*b* of potentiometer 12. The negative feedback voltage stabilizes the amplifier operation by eliminating changes in the output voltage applied to the load device which might otherwise be caused by changes in the supply voltage at lines L1 and L2 or by electrical drifts in the transistor preamplifier due to temperature changes.

From the foregoing description of operation of the system of FIG. 1, it will be apparent that the resultant of the unidirectional positive input signal voltage and the unidirectional negative feedback voltage is amplified in the preamplifier. The amplified unidirectional voltage is applied from the last preamplifier stage transistor T3 to charge capacitor C3. The voltage across capacitor C3 which is proportional to the input signal voltage constitutes one component of the total voltage which is used to control the firing circuit.

The second component of the total voltage which is used to control the firing circuit is proportional to the integrated volt-seconds appearing across the gating-type power controlling device SCR. The integrated volt-seconds appearing across silicon controlled rectifier SCR may be described as the area under the voltage wave of the rectified voltage appearing across silicon controlled rectifier SCR. As will be apparent, the voltage appearing across silicon controlled rectifier SCR is applied to charge capacitor C2 as hereinbefore described. Resistor R5 has a high resistance so that the RC time constant of the charging circuit comprising resistor R5 and capacitor C2 is long relative to the time of a half-cycle of the voltage wave. This long time constant which may be, for example, five cycles or more affords the integration result, that is, due to this long time constant, the charge on capacitor C2 or the voltage thereacross will at any instant be proportional to the integrated volt-seconds appearing across the silicon controlled rectifier. This time constant is selected so that the integrated voltage alone would not reach the firing value until the end or beyond the end of the half-cycle.

The voltage across capacitor C2 is added to the voltage across capacitor C3 and, when the sum thereof reaches a predetermined firing value, it renders unijunction transistor UT conducting. As a result, capacitor C2 discharges to cause a pulse of current to flow through the unijunction transistor and through resistor R4. This pulse of current through resistor R4 fires silicon controlled rectifier SCR. The latter then continues conducting for the remainder of the half-cycle of the supply voltage wave although the current pulse through resistor R4 decreases. As capacitor C2 discharges, the voltage across the emitter-base B1 junction of the unijunction transistor decreases to render the unijunction transistor non-conducting. When the voltage across silicon controlled rectifier SCR decreases at the end of such half-cycle of the supply voltage wave, it stops conducting.

The firing circuit then repeats the aforementioned operation on the next half-cycle of the voltage wave. That is, capacitor C2 recharges and discharges through the unijunction transistor again to fire the silicon controlled rectifier.

Each time that the silicon controlled rectifier conducts, a pulse of current flows therethrough to load device LD. The alternate current pulses applied to the load device are of opposite polarity so that the load device is energized with alternating current.

Unidirectional diode UD1 in the power supply circuit provides for the application from the single power supply circuit of both a smooth unidirectional voltage to the preamplifier and bias circuits and half-wave voltage pulses to the unijunction transistor, these pulses being synchronized with the half-wave voltage pulses appearing across the silicon controlled rectifier. To this end, the unidirectional voltage applied from the power supply circuit across conductors 2 and 4 is smoothed by capacitor C1 to afford a supply voltage for the preamplifier transistors T1, T2 and T3 and the bias circuit. But the voltage applied from the power supply circuit across conductors 6 and 4 is not smoothed but instead is in the form of half-wave voltage pulses appearing across breakdown diode BD2. To prevent the preamplifier supply voltage from modifying these pulses, diode UD1 is connected as shown to prevent discharge current from capacitor C1 from flowing through resistors R1 and R2 to conductor 6. The voltage pulses appearing across conductors 6 and 4 are synchronized with the voltage pulses appearing across the positive and negative output terminals of rectifier bridge RB2. Consequently, each time the base B2-base B1 voltage of unijunction transistor UT increases on successive half-cycles, the anode-cathode voltage of silicon controlled rectifier SCR also increases in synchronism therewith. With this arrangement and because the half-cycle voltage pulse applied to the unijunction transistor and the silicon controlled rectifier have the same frequency of source L1–L2, the silicon controlled rectifier will be fired at the same point on each half-cycle of its supply voltage wave.

From the foregoing, it will be apparent that the firing point of the silicon controlled rectifier may be advanced or retarded as desired to change the energization of the load device by adjusting the magnitude of the input signal voltage. Increase in the magnitude of the input voltage proportionally increases the voltage across capacitor C3. Therefore, unijunction transistor UT will conduct at a lower voltage on capacitor C2 whereby the silicon controlled rectifier firing point will be advanced. That is, the silicon controlled rectifier will fire earlier on each half-cycle of its voltage wave and will conduct for longer periods and thereby increase the energization of the load device. Decrease in the magnitude of the input voltage proportionally decreases the voltage across capacitor C3. Therefore, a higher voltage will be required on capacitor C2 to render the unijunction transistor conducting. The result is a retardation of the firing point of the silicon controlled rectifier. That is, the silicon controlled rectifier will fire later on each half-cycle of its voltage wave and will conduct for shorter periods and thereby decrease the energization of the load device.

The features of the invention hereinbefore described provide an extremely linear output voltage to input voltage relationship. The feature whereby firing of a gating-type power controlling device such as a silicon controlled rectifier is controlled with a signal proportional to the integral relative to time of the voltage half-cycle appearing across such device in combination with the feature whereby an input control signal is used to set the initial condition or point on the voltage wave half-cycle at which the device is fired provide the aforementioned linearity. Assuming that the unidirectional input voltage is linearly adjustable by a potentiometer or the like to cause a linearly proportional change in the voltage on capacitor C3, any such change will require a reciprocal increase or decrease in the integrated voltage, or sum of the volt-seconds, on capacitor C2. This will cause a change in silicon controlled rectifier firing point such that the change in the average value of the magnitude of the output voltage to the load will be linearly proportional to the adjustment in the magnitude of the input voltage.

Another important aspect of the invention is that the extremely good linearity obtained as aforementioned is essentially independent of the voltage wave form supplied to the gating-type power control device. That is, the desirable linearity will be obtained if the voltage has a sine wave, a modified sine wave or other form of wave as will hereinafter appear.

Referring to the schematic illustration of the system of FIG. 7:

$E_s$=average value of the power source voltage.

$E_g$=average value of the power control device voltage.

$E_L$=average value of the load device voltage.

$E_c$=average value of the controlling signal voltage.

The lower case symbols $e_s$, $e_g$, $e_L$ and $e_c$ are in the instantaneous values of the above voltages.

$e_{gf}$=the instantaneous value of voltage required to produce gating action (firing) of the power control device.

$t$=time.

$T$=period of ½ cycle of the supply voltage.

$T_g$=time of gating or firing.

$K$=constant of proportionality between $E_c$ and $E_L$.

In the schematic circuit in FIG. 7;

$$E_L=E_s-E_g$$

and $$e_L=e_s-e_g$$

(1) $$\text{If } E_L=\frac{1}{T}\int_0^T e_L dt=\frac{1}{T}\int_0^T (e_s-e_g)\,dt$$
$$=\frac{1}{T}\int_0^T e_s dt-\frac{1}{T}\int_0^T e_g dt$$

and when $$e_g\approx e_s, 0\leqq t\leqq T_g$$

and when $$e_g\approx 0, T_g\leqq t\leqq T$$

an object of the control system is to gate or fire the power control device when (2) $$E_c+\int_0^{T_g} e_g dt=E_{gf}$$

$E_{gf}$ being the average value of voltage required to cause firing of the power control device, and $E_c=e_c$ is smooth or constant unidirectional voltage.

A linear output voltage to input voltage relationship is defined by:

(3) $$E_L=KE_c$$

From Equation 2:

(4) $$\int_0^{T_g} e_g dt=E_{gf}-E_c$$

Since, (5) $$\int_0^T e_g dt=\int_0^{T_g} e_g dt+\int_{T_g}^T 0\,dt$$

because the voltage $e_g$ across the power control device drops to zero upon firing, then (6) $$\int_0^T e_g dt=\int_0^{T_g} e_g dt$$

From Equations 1 and 6, (7) $$E_L=\frac{1}{T}\int_0^T e_s dt-\frac{1}{T}\int_0^{T_g} e_g dt$$

From Equations 4 and 7, (8) $$E_L=\frac{1}{T}\int_0^T e_s dt-E_{gf}+E_c$$

Now then, resistor R5 in the voltage integration circuit in FIG. 1 is preferably given a resistance value whereby:

(9) $$E_{gf}=\int_0^T e_s dt$$

In other words, as shown by Equation 9, resistor R5 has a value such that the voltage across capacitor C2 alone causes firing of the power control device at the end of the half-cycle in the absence of an input signal voltage on capacitor C3. That is, the integrated voltage developed by current flow through resistor R5 reaches a value, at the end of the half-cycle of the supply voltage on lines L1–L2 to cause firing of the silicon controlled rectifier SCR. While under this condition no current would flow to the load device because the supply voltage drops to zero value at the end of each half-cycle, yet this condition is useful because the input signal can then be used to advance the firing point as desired.

From Equations 8 and 9,

(10) $$E_L=\frac{1}{T}E_c$$

and if,

(11) $$\frac{1}{T}=K$$

then

(12) $$E_L=KE_c$$

Now, comparing Equations 3 and 12, it will be seen that the average value of the voltage of the load device is linearly proportional to the average of the controlling signal voltage. Thus, the system has a linear output voltage to input voltage relationship.

From the foregoing, it will be apparent that such linearity will not be affected by different wave forms of the supply voltage at lines L1–L2. The system will have a linear output voltage to input voltage relationship if the supply voltage has a sine wave form as shown in FIG. 8 which is defined by the equation, $$e_s = V_s \sin wt \qquad (13)$$

or if the supply voltage has a square wave form as shown in FIG. 9 which is defined by the equation, $$e_s = A \sin wt + \frac{A}{3} \sin 3\ wt + \frac{A}{5} \sin 5wt + \cdots$$

where $$A = \frac{4}{\pi} Vs$$

or even if the supply voltage has a wave form defined as $$e_s = A_0 + A_1 \sin wt + B_1 \cos wt + A_2 \sin 2wt + B_2 \cos 2wt + \ldots An \sin nwt + B_n \cos nwt$$

which, depending upon the values given to $A_0$, $A_1$, $B_1$, etc., will describe almost any possible wave shape.

From the foregoing, it will be interesting to note that if the supply voltage has a perfect single-phase sine wave form defined by Equation 13 and shown in FIG. 8, then $$\int V_s \sin wt = \int e_g dt$$

and $$\int e_g dt = \frac{V_s}{w} \cos wt$$

which turns out to be a similar type of firing voltage shown in FIG. 10 as has been obtained heretofore by shifting the phase of a sine wave substantially 90 degrees by the use of phase-shifting devices. However, such phase-shifting devices do not attain the performance of the integrating circuit hereinbefore described because the performance of such integrating circuit is not dependent upon a particular wave form.

Referring to FIG. 11, there is shown a graphical illustration of the linearity that can be obtained from systems such as that hereinbefore described and shown in FIG. 1 and modifications thereof hereinafter described. In FIG. 11 wherein output voltage is plotted against input voltage and the numerals on the vertical and horizontal axes are indicative of exemplary voltage values, the relationship is essentially a straight line SL. It will be apparent from this graph that equal changes in the input voltage afford equal changes in the output voltage in the same direction.

Figure 2:
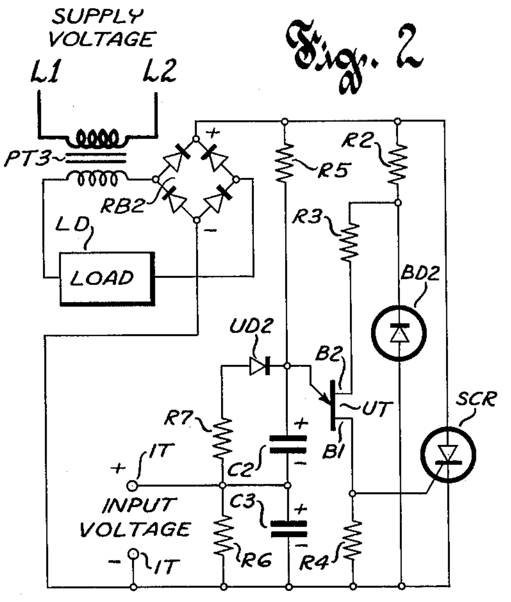
FIG. 2 is a diagrammatic illustration of a first modification of the invention.

The modification shown in FIG. 2 differs from the system of FIG. 1 primarily in that the base B2 to base B1 voltage of the unijunction transistor UT is applied from across the silicon controlled rectifier SCR whereby the need for a separate power supply circuit for supplying the interbase voltage for the unijunction transistor is eliminated. Another difference is that the modification in FIG. 2 has fewer components than a circuit such as shown in FIG. 1. However, due to the fewer components in the modification in FIG. 2, this circuit does require more driving power from the input circuit.

Referring to FIG. 2, wherein reference characters like those in FIG. 1 are employed for like-functioning elements, there is shown an alternating current supply voltage source connected through lines L1 and L2 to the primary winding of a transformer PT3. The secondary winding of the transformer is connected in series with load device LD to the input terminals of full-wave rectifier bridge RB2. The anode-cathode junction of silicon controlled rectifier SCR is connected across the positive and negative output terminals of bridge RB2.

Current limiting resistor R2 and voltage regulating, breakover diode BD2 are connected in series across the anode-cathode junction of silicon controlled rectifier SCR instead of to a separate power supply as in FIG. 1. The junction of resistor R2 and diode BD2 is connected through a current limiting resistor R3 to base B2 of unijunction transistor UT. Base B1 of the unijunction transistor is connected directly to the gate of silicon controlled rectifier SCR and also through resistor R4 to the cathode of the latter. Resistor R5 and capacitors C2 and C3 are connected in series across the anode-cathode junction of silicon controlled rectifier SCR. Resistor R6 is connected across capacitor C3. Resistor R7 and unidirectional diode UD2 are connected in series in that order from the junction of capacitors C2 and C3 to the other side of capacitor C2. While input terminals IT are shown connected directly across resistor R6 to avoid complicating the drawing, it will be understood that one or more preamplifier stages could be interposed therebetween and supplied from a separate unidirectional voltage power supply circuit as shown in FIG. 1. Also, the input voltage is preferably adjustable in magnitude as by adjusting the tap of a potentiometer or the like.

In FIG. 2, a voltage is applied from lines L1 and L2 through transformer PT3 and load LD to the input terminals of rectifier bridge RB2. A unidirectional voltage is applied from the positive and negative output terminals of bridge RB2 across the anode and cathode of silicon controlled rectifier SCR. The voltage appearing across silicon controlled rectifier SCR causes current flow through resistor R2 and diode BD2. A regulated voltage appearing across diode BD2 is applied through resistors R3 and R4 across the base B2-base B1 junction of unijunction transistor UT.

Capacitor C3 charges to the magnitude of the input voltage. On each half-cycle of the voltage appearing across silicon controlled rectifier SCR, capacitor C2 charges in response to current flow through resistor R5 and capacitors C3 and C2. The voltage on capacitor C2 is proportional to the sum of the integrated volt-seconds appearing across the silicon controlled rectifier. When the sum of the voltages on capacitors C3 and C2 reaches a predetermined value, which sum is applied across the emitter-base B1 junction of the unijunction transistor, the latter is rendered conducting. A pulse of current flows through resistor R4 as capacitor C2 discharges through the unijunction transistor. The voltage pulse appearing across resistor R4 is applied across the gate and cathode of the silicon controlled rectifier to fire the latter. As a result, current flows from the right-hand end of the secondary winding of transformer PT3 through the left-hand input terminal and positive output terminal of bridge RB2, the anode and cathode of silicon controlled rectifier SCR, the negative output terminal and the right-hand input terminal of bridge RB2 and load device LD to the left-hand end of the transformer secondary winding. On each alternate half-cycle, the silicon controlled rectifier is fired as aforementioned to cause current to flow through load device LD in the other direction. As a result, load device LD is energized with alternating current the magnitude of which is controllable by advancing or retarding the firing point of the silicon controlled rectifier as described in connection with FIG. 1. Since the emmitter to base B1 voltage required to maintain unijunction transistor UT conducting is directly proportional to the interbase voltage and the latter falls to zero when controlled rectifier SCR is fired, the unijunction transistor allows capacitor C2 to discharge completely.

The modification shown in FIG. 3 differs from the systems hereingefore described primarily in that the circuit arrangements afford the elimination of diode UD2 and resistor R7 appearing in FIGS. 1 and 2. It will be recalled that diode UD2 and resistor R7 in FIGS. 1 and 2 provide a unidirectional discharge path for capacitor C2 to prevent the latter from charging in the reverse direction which if permitted might change the firing point of the controlled rectifier. In the modification of FIG. 3, the supply voltage for preamplifier transistors T4 and T3 is applied from across silicon controlled rectifier SCR. When the latter fires, the voltage thereacross and consequently the supply voltage to the preamplifier transistors decreases substantially to zero value. As a result, capacitor C3 can discharge through resistor R6 and there is less tendency for the voltage on capacitor C3 to charge capacitor C2 in the reverse direction as hereinafter more fully described. Other differences in the circuit of FIG. 3 will become apparent as the description thereof proceeds.

Referring to FIG. 3, wherein reference characters like those in FIGS. 1 and 2 have been employed for like-functioning elements, there is shown an alternating current supply voltage source connected through lines L1 and L2 and load device LD in series to the input terminals of rectifier bridge RB2. The positive and negative output terminals of bridge RB2 are connected across the anode and cathode of silicon controlled rectifier SCR. The primary winding of a transformer PT4 is connected across the input terminals of bridge RB2 whereby such primary winding is also connected across silicon controlled rectifier SCR. The opposite ends of the secondary winding of transformer PT4 are connected through rectifying unidirectionally conducting diodes UD3 and UD4, respectively, to a common point CP1. Common point CP1 is connected through a resistor R16 and a voltage regulating device such as a breakover diode BD3 of the Zener type or the like to a center tap CT1 on the secondary winding of transformer PT4. A conductor 14 is connected to the junction of resistor R16 and diode BD3 and a conductor 16 is connected to the junction between diode BD3 and center tap CT1 to supply voltage to the preamplifier transistors and interbase voltage to the unijunction transistor.

The preamplifier circuit comprises two amplifier stages including a first transistor T4 connected in a common base configuration and a second transistor T3 connected as in FIG. 1 in a common emitter configuration. The base of transistor T4 is connected to conductor 14 and the collector thereof is connected to the base of transistor T3. Input signal voltage terminals IT are connected across the base-emitter junction of transistor T4, the negative input terminal being connected through conductor 14 to the base and the positive input terminal being connected to the emitter of transistor T4. The collector of transistor T4 is also connected through resistor R11 to conductor 16. The collector of transistor T3 is connected to conductor 14 and the emitter thereof is connected through resistor R6 to conductor 16. Capacitor C3 is connected across resistor R6. Common point CP1 is also connected through resistor R5 and capacitors C2 and C3 in series to conductor 16. Base B2 of unijunction transistor UT is connected to conductor 14 and base B1 thereof is connected through the primary winding of a transformer PT5 to conductor 16. The junction of resistor R5 and capacitor C2 is connected to the emitter of the unijunction transistor. The secondary winding of transformer PT5 is connected across the gate and cathode of silicon controlled rectifier SCR.

A bias voltage for the first stage of the preamplifier is supplied from lines L1 and L2. To this end, the primary winding of a transformer PT6 is connected across lines L1 and L2 and the secondary winding thereof is connected across the input terminals of a full-wave rectifier bridge RB4. The positive output terminal of bridge RB4 is connected through a resistor R17, conductor 14, the resistor 18*a* of a bias voltage adjusting potentiometer 18 and a conductor 20 to the negative output terminal of the bridge. A voltage regulating device such as a breakover diode BD4 of the Zener type or the like is connected across conductors 14 and 20 to limit the voltage to a predetermined value. A capacitor C5 is connected across diode BD4 to smooth the voltage. A movable tap 18*b* on potentiometer 18 is connected through a resistor R18 to the emitter of transistor T4 whereby the voltage drop across the left-hand portion of potentiometer resistor 18*a* reverse-biases the emitter-base junction of the transistor.

A negative feedback voltage is applied to the first stage transistor of the preamplifier from across the load device. To this end, the primary winding of a transformer PT7 is connected across load device LD. A center tap CT2 on the secondary winding of the transformer is connected through conductor 14, the emitter-base junction of transistor T4 in the reverse direction and resistors R19 and R20 to a common point CP2. Common point CP2 is connected through rectifying, unidirectional conducting diodes UD5 and UD6 to the opposite ends of the secondary winding of transformer PT7, respectively. A smoothing capacitor C6 is connected between conductor 14 and the junction between resistors R19 and R20 to smooth the feedback voltage.

The operation of the system of FIG. 3 will now be described. A voltage is applied from lines L1 and L2 through load device LD across the input terminals of rectifier bridge RB2 and from the positive and negative output terminals of bridge RB2 across the anode and cathode of silicon controlled rectifier SCR. A voltage proportional to the voltage appearing across the silicon controlled rectifier is applied from the input terminals of bridge RB2 through transformer PT4. The secondary current of transformer PT4 is rectified by diodes UD3 and UD4 to cause full-wave rectified current to flow from common point CP1 through resistor R16 and breakover diode BD3 to center tap CT1.

The voltage appearing across diode BD3 is applied across conductors 14 and 16 to supply operating voltage to the base-collector junction of transistor T4, the collector-emitter junction of transistor T3 and the interbase B2–B1 junction of unijunction transistor UT.

A voltage is supplied from lines L1 and L2 through transformer PT6 to the input terminals of rectifier bridge RB4 to cause current to flow from the positive output terminal of the bridge through resistor R17, conductor 14, bias potentiometer resistor 18*a* and conductor 20 to the negative output terminal of the bridge. The voltage drop appearing across resistor 18*a* of the bias potentiometer is limited by breakover diode BD4 connected thereacross and smoothed by capacitor C5 connected across diode BD4. The voltage drop appearing across the left-hand portion of potentiometer resistor 18*a* is applied through movable tap 18*b*, resistor R18 and conductor 14 to reverse-bias the emitter-base junction of transistor T4, that is, to bias the emitter negative relative to the base.

An input signal voltage is applied to input terminals IT. The input voltage is unidirectional and has the polarity indicated by the positive and negative symbols adjacent the input terminals. This input voltage is applied through conductor 14 to overcome the bias voltage and to render the emitter of transistor T4 positive relative to the base thereof. This input voltage renders transistor conducting in accordance with the magnitude thereof to cause current to flow from conductor 14 through the base-collector junction and resistor R11 to conductor 16. The voltage drop across resistor R11 shifts the voltage at the base of transistor T3 positive relative to the emitter thereof to render transistor T3 conducting. As a result, current flows from conductor 14 through the collector-emitter junction of transistor T3 and capacitor C3 to conductor 16. Capacitor C3 charges and causes the current to be diverted through resistor R6. As will be apparent, the preamplifier comprising transistors T4 and T3 amplifies the input voltage and charges capacitor C3 to a voltage proportional to the input voltage.

On each half-cycle of the voltage appearing across silicon controlled rectifier SCR, current also flows from common point CP1 through resistor R5 and capacitor C2 in series and then through capacitor C3 or resistor R6 depending upon the charge on capacitor C3 and then through conductor 16 to center tap CT1. This current flow charges capacitor C2 under the control of the long time constant RC circuit as aforementioned such that the voltage in capacitor C2 is proportional to the integrated volt-seconds appearing across the silicon controlled rectifier. The value of resistor R5 is preferably selected so that such integrated voltage would not cause unijunction transistor UT to conduct until the end or beyond the end of each half-cycle when no input signal is applied. Consequently, the voltage on capacitor C3 due to an input voltage is effectively added to the integrated voltage to advance the conduction point of unijunction transistor UT on each half-cycle.

When the sum of the voltages on capacitors C2 and C3 reaches a predetermined value, capacitor C2 discharges through the emitter-base B1 junction of the unijunction transistor to cause a pulse of current to flow through the primary winding of transformer PT5. As a result, a voltage pulse is applied from the secondary winding of transformer PT5 across the gate and cathode of silicon controlled rectifier SCR to fire the latter. This causes current flow to load device LD.

When current flows in load device LD, a negative feedback voltage is applied from across the load device through transformer PT7. Diodes UD5 and UD6 afford full-wave rectification of the transformer secondary current to cause a positive voltage to be applied from center tap CT2 through conductor 14 to the base of transistor T4 and to cause a negative voltage to be applied from common point CP2 through resistors R20 and R19 to the emitter of the transistor. It will be apparent that this negative feedback voltage is opposite in polarity to the input voltage applied to the emitter-base junction of transistor T4. This negative feedback voltage is smaller than the input voltage and decreases the emitter current of transistor T4 from the value caused by the input voltage to stabilize the amplifier operation under varying line voltage and varying temperature. Capacitor C6 smooths the feedback voltage. Resistor R20 limits the current flow to capacitor C6 from transformer PT7. Resistor R19 limits the current flow to capacitor C6 from the input terminals. Resistor R18 limits the bias voltage that can be applied to transistor T4 from potentiometer 18.

Each time that capacitor C2 starts to discharge as aforementioned to fire the silicon controlled rectifier, the voltage across the latter and the interbase voltage of the unijunction transistor drop to near zero value whereby the unijunction transistor discharges capacitor C2 completely to terminate the current pulse to transformer PT5. However, silicon controlled rectifier SCR continues to conduct after it is fired to the end of the half-cycle.

A unidirectional discharge path for preventing capacitor C2 from charging in the reverse direction such as is employed in FIGS. 1 and 2 is not required in FIG. 3. That is, resistor R7 and diode UD2 as employed in FIGS. 1 and 2 may be omitted from FIG. 3. The reason for this is that there is less tendency for capacitor C2 to charge in the reverse direction. Since in FIG. 1 the preamplifier transistors are supplied with voltage from a separate power supply circuit, capacitor C3 remains charged when capacitor C2 discharges and tends to charge capacitor C2 in the reverse direction. But in FIG. 3, preamplifier transistors T4 and T3 are supplied with voltage from across the silicon controlled rectifier. When the silicon controlled rectifier fires, the voltage thereacross decreases substantially to zero value. Consequently, the voltage supplied to the preamplifier transistors also decreases correspondingly. This decreases the current flow through resistor R6 allowing capacitor C3 to discharge through this resistor. Therefore, capacitor C3 does not charge capacitor C2 in the reverse direction and the aforementioned unidirectional discharge path for the latter is not required.

FIG. 4 shows a modification of the system of FIG. 3. The portion of the circuit enclosed in broken lines 22 in FIG. 3 may be disconnected and the circuit enclosed in broken lines 22*a* shown in FIG. 4 may be connected in place thereof. By this modification, unijunction transistor UT is omitted and a Shockley 4-layer diode 4L is connected from the junction between resistor R5 and capacitor C2 to the upper end of the primary winding of transformer PT5.

Diode 4L is a two terminal, silicon, semi-conductor switch having two stable states as shown by the voltage V versus current I curve in FIG. 4*a*. The "off" or high impedance state is shown in region H while the "on" or low impedance state is shown in region L. This diode is turned "on" when a voltage exceeding switching voltage $V_s$ shown in FIG. 4*a* is applied across the terminals thereof. The diode is turned "off" by decreasing the current flowing therethrough to a value less than holding current $I_h$ shown in FIG. 4*a*.

When diode 4L is employed in the system of FIG. 3, resistor R5 may be given a resistance value such that the voltage on capacitor C2 reaches the switching voltage $V_s$ at the end of each half-cycle of the voltage appearing across the silicon controlled rectifier SCR. Then the voltage on capacitor C3 which is controlled or set by the input signal is used to advance on such half-cycle the point at which diode 4L turns "on." When the sum of the voltages on capacitors C2 and C3 exceeds switching voltage $V_s$ at a point on each half-cycle determined by the magnitude of the input voltage, diode 4L is turned "on" to pass a pulse of current through the primary winding of coupling transformer PT5 to fire the silicon controlled rectifier and to energize the load device. As capacitor C2 discharges through diode 4L, the current flowing through the latter dreceases to a value less than holding current $I_h$. As a result, diode 4L turns "off." However, the silicon controlled rectifier continues to conduct after firing thereof for the remainder of each half-cycle.

FIG. 5 shows another modification of the system of FIG. 3. To adopt this modification, the portion shown in broken lines 24 in FIG. 3 and including the portion within broken lines 22 is disconnected and the circuit shown in broken lines 24*a* in FIG. 5 is connected in place thereof.

Referring to FIG. 5, there is shown a firing circuit for the silicon controlled rectifier employing a "Transwitch" or Transitron's silicon controlled switch SCS. This silicon controlled switch is a PNPN bistable switching device and is provided with a collector C, an emitter E and a gate G. The juction of resistor R5 and capacitor C2 is connected through collector C and emitter E of silicon controlled switch SCS in that order to the upper end of the primary winding of transformer PT5. The junction of resistor R5 and capacitor C2 is also connected through a breakdown diode BD5 of the Zener type or the like and a resistor R21 in series to negative conductor 16. The junction of diode BD5 and resistor R21 is connected directly to gate G of silicon controlled switch SCS.

In the modification shown in FIG. 5, resistor R5 is preferably given a value of resistance such that the integrated voltage on capacitor C2 reaches the breakdown voltage of diode BD5 at the end or beyond the end of each half-cycle of the voltage appearing across silicon controlled rectifier SCR. Therefore, the voltage on capacitor C3 which is controlled or set by the input signal may be used to advance on such half-cycle the point at which diode BD5 breaks down.

When the sum of the voltages on capacitors C2 and C3 reaches a predetermined value, diode BD5 breaks down and passes current. As a result, capacitor C2 discharges and causes current to flow through diode BD5 and resistor R21. The voltage drop across resistor R21 is applied to the gate-emitter junction of silicon controlled switch SCR to shift gate G positive relative to emitter E. As a result, the silicon controlled switch SCS switches "on" and capacitor C2 discharges through the collector-emitter junction thereof to cause a pulse of current to flow in the primary winding of transformer PT5 whereby to fire silicon controlled rectifier SCR. When the silicon controlled rectifier fires, load device LD is energized and the voltage across the silicon controlled rectifier decreases to near zero value. When the voltage on capacitor C2 decreases as it discharges, diode BD5 stops conducting to discontinue the gate voltage on silicon controlled switch SCS. Capacitor C3 also discharges through its parallel resistor R6 when silicon controlled rectifier SCR fires and the preamplifier voltage decreases to zero value. When capacitors C2 and C3 have discharged so that the voltage thereacross has reduced sufficiently the voltage on the collector-emitter junction of switch SCS, the latter switches "off." However, silicon controlled rectifier SCR continues to conduct for the remainder of the half-cycle. On the next half-cycle, capacitors C2 and C3 recharge and the operation is repeated to energize the load device.

Referring to FIG. 6, there is shown a still further modification of a voltage integrating firing control circuit for silicon controlled rectifiers. In FIG. 6, reference characters like those in FIG. 3 have been employed for similarly-functioning elements. The modification in FIG. 6 differs from the systems hereinbefore described primarily in that a tunnel diode and a gating, unidirectional diode are employed to control firing of silicon controlled rectifiers and a unijunction transistor is employed to discharge the voltage integrating capacitor. Other differences will become apparent as the description proceeds.

Referring to FIG. 6, there is shown a pair of silicon controlled rectifiers SCR1 and SCR2 for controlling current to load device LD on respectively alternate half-cycles of the supply voltage. The alternating current supply source is connected through line L1, the anode and cathode of silicon controlled rectifier SCR1 and load device LD to line L2 for controlling current to the load device on first half-cycles. The supply source is connected through line L2, load device LD and the anode and cathode of silicon controlled rectifier SCR2 to line L1 for controlling current to the load device on alternate half-cycles of the supply voltage. While two silicon controlled rectifiers have been employed in FIG. 6, it will be apparent that a single silicon controlled rectifier and a full-wave rectifier bridge could be employed in place thereof in the manner shown in FIG. 3. Also, two silicon controlled rectifiers in the manner of FIG. 6 could be employed in place of the single silicon controlled rectifier and rectifier bridge in FIG. 3.

As shown in FIG. 6, silicon controlled rectifiers SCR1 and SCR2 are connected in reversed-parallel relation between line L1 and load device LD. The primary winding of transformer PT4 is connected across the silicon controlled rectifiers. The secondary winding of such transformer is of the center tap type and the opposite ends thereof are connected through rectifying unidirectional diodes UD3 and UD4 to a common point CP1. Common point CP1 is connected in a first path through resistor R5 and capacitor C2 in series to center tap CT1 on the transformer secondary winding and in a second path through resistor R16 and the interbase junction B2–B1 of a unijunction transistor UT1 in series to center tap CT1. The junction between resistor R16 and base B2 is connected through the base-collector junction of a constant current passing, common base configuration transistor T5 and a reference voltage resistor R22 in series to center tap CT1.

The junction between resistor R5 and capacitor C2 is connected through a current limiting resistor R23, a tunnel diode TD, a gating rectifier GR of the unidirectional diode type and resistor R22 in series to center tap CT1. A coupling capacitor C7 and the primary winding of a coupling transformer PT8 are connected in series across tunnel diode TD. A first secondary winding S1 of transformer PT8 is connected across the gate and cathode of silicon controlled rectifier SCR1. The other secondary winding S2 of transformer PT8 is connected across the gate and cathode of silicon controlled rectifier SCR2. Input signal voltage terminals IT are connected across the emitter-base junction of transistor T5, the positive input terminal being connected to the emitter and the negative input terminal being connected to the base of the transistor.

The operation of the system of FIG. 6 will now be described. The alternating voltage appearing across silicon controlled rectifiers SCR1 and SCR2 is applied through transformer PT4. The secondary current of this transformer is rectified by diodes UD3 and UD4 to cause a full-wave rectified current to flow from common point CP1 through resistor R5 and capacitor C2 to center tap CT1 to charge capacitor C2. As capacitor C2 charges, the voltage thereacross is proportional to the integrated volt-seconds appearing across the silicon controlled rectifiers. A voltage is applied from common point CP1 and center tap CT1 through resistor R16 across base B2 and base B1 of unijunction transistor UT1. The voltage appearing across the interbase junction of the unijunction transistor is applied through resistor R22 across the base-collector junction of transistor T5.

When an input voltage is applied through terminals IT to the emitter-base junction of transistor T5, a current (of constant magnitude) flows from common point CP1 through resistor R16, the base-collector junction of transistor T5 and resistor R22 to center tap CT1. The voltage drop across resistor R22 causes a positive voltage to be applied to the lower side of gating rectifier GR to block current flow through the latter in its low impedance direction.

As capacitor C2 charges, the voltage thereacross increases and has a polarity shown by the positive and negative symbols adjacent thereto. When the voltage on capacitor C2 during each half-cycle of the voltage appearing across the silicon controlled rectifiers increases above the magnitude of the aforementioned blocking voltage on gating rectifier GR, current starts to flow in a circuit in parallel with capacitor C2. Thus, current starts to flow in such parallel circuit through resistor R23, tunnel diode TD, gating rectifier GR and resistor R22 in series.

Tunnel diode TD has an operating characteristic graphically depicted by the curve in FIG. 6*a*, wherein current I flowing through the tunnel diode is plotted against voltage V applied across the tunnel diode. As shown in FIG. 6*a*, the tunnel diode is a switching device having two stable states, that is, a low voltage or "off" state and a high voltage or "on" state. The "off" state is the region from zero to peak voltage $Vp$. The "on" state is the region from valley voltage $Vv$ to forward peak voltage $Vfp$. The negative resistance portion of the tunnel diode characteristic affords an unstable state in the region from peak voltage $Vp$ to valley voltage $Vv$. Broken lines LL1 and LL2 depict load lines for the tunnel diode.

When the voltage on capacitor C2 in FIG. 6 increases as aforementioned to apply a voltage $Vp$ on the tunnel diode whereby the current in the tunnel diode exceeds peak current $Ip$, the tunnel diode switches from point *a* to point *b*. That is, the tunnel diode switches from its low voltage or "off" state to its high voltage or "on" state along load line LL1 shown in FIG. 6*a* at an extremely high speed. The instantaneous increase in the voltage across the tunnel diode causes a pulse of current to flow through coupling capacitor C7 and the primary winding of transformer PT8. As a result, a voltage is applied from secondary winding S1 to shift the gate of controlled rectifier SCR1 positive relative to the cathode thereof to fire the controlled rectifier. This causes current to flow from lines L1 and L2 to load device LD to energize the latter.

When controlled rectifier SCR1 is fired as aforementioned, the voltage thereacross decreases to zero value. Consequently, the interbase voltage of unijunction transistor UT1 also drops to zero value. Such decrease in the interbase voltage allows the unijunction transistor to conduct at a lower emitter-to-base B1 voltage. As a result, the unijunction transistor is rendered conducting and capacitor C2 discharges through the emitter-base B1 junction thereof. Controlled rectifier SCR1 continues to conduct for the remainder of the half-cycle of the supply voltage following firing thereof although the firing voltage across its gate and cathode terminates. Since controlled rectifier SCR1 continues to conduct for the remainder of the half-cycle, the interbase voltage on unijunction transistor UT1 remains at near zero value during this time whereby capacitor C2 discharges completely through the emitter-base B1 junction thereof.

As capacitor C2 discharges as aforementioned to decrease the voltage on the tunnel diode to valley voltage $V_v$, the tunnel diode switches back from point *c* to point *d*. That is, the tunnel diode switches from its high voltage or "on" state back to its low voltage or "off" state along load line LL2. As capacitor C2 discharges completely, the current in the tunnel diode decreases along its characteristic curve from point *d* toward zero value.

On the next half-cycle of the supply voltage, capacitor C2 recharges and the system of FIG. 6 functions in the same manner to send a pulse of current through the primary winding of transformer PT8. However, secondary winding S2 is now effective to apply a positive firing voltage across the gate and cathode of controlled rectifier SCR2. It will be apparent that while a firing voltage is applied to both controlled rectifiers SCR1 and SCR2 on each half-cycle, the controlled rectifiers control current flow to the load devices only on alternate half-cycles due to their orientation with respect to the positive and negative half-cycles of the supply voltage.

Referring to FIG. 6, let it be assumed that the input voltage is adjusted to a predetermined value such that tunnel diode TD switches from its low voltage or "off" state to its high voltage or "on" state at the end of each half-cycle of the supply voltage. For exemplary purposes, this may be the maximum value of input voltage from which the magnitude of the input voltage may be decreased as desired to advance on each half-cycle the point at which the controlled rectifiers are fired. Under such maximum value of input voltage and proportional constant current flow through resistor R22, the voltage drop across the latter affords a back voltage on gating rectifier GR of a predetermined value. The back voltage on gating rectifier GR has a magnitude such that the current in the tunnel diode does not reach its peak value $I_p$ until the integrated voltage on capacitor C2 has reached a value corresponding to the end or beyond the end of the half-cycle.

The aforementioned reference to constant current flow through resistor R22 means that the common base configuration connection of transistor T5 makes the same a constant current regulator. That is, transistor T5 passes a current proportional to the input voltage as soon as the base-collector voltage thereof reaches a certain minimum value at the start of each half-cycle and maintains such current constant almost throughout the entire half-cycle until the base-collector voltage drops below such value at the end of such half-cycle. Therefore, the current flowing in resistor R22 is constant except at the extreme beginning and end of each half-cycle and is constant throughout the portion of each half-cycle during which firing of the controlled rectifiers is usefully set to take place.

Under the aforementioned condition of maximum input voltage, it will be seen that firing of the controlled rectifiers at the ends of the half-cycles will not energize the load device because the supply voltage is then at zero value. However, it will also be seen the decremental changes in the magnitude of the input voltage will progressively decrease the current flow in resistor R22 and the reverse voltage on gating rectifier GR. Consequently, the voltage on capacitor C2 need reach progressively lesser values to cause peak current $I_p$ flow in and switching of the tunnel diode. Thus, the decreases in the input voltage progressively advance the firing point of the controlled rectifiers on each half-cycle whereby adjustably to control energization of the load device. From the foregoing, it will be apparent that the algebraic sum of the voltages on resistor R22 and capacitor C2 is used to control switching of the tunnel diode and consequent firing of the controlled rectifiers. That is, the voltage on resistor R22 is subtracted from the voltage on capacitor C2 by use of gating rectifier GR and the difference voltage is applied to control switching of the tunnel diode. On the other hand, in the systems of FIGS. 1 and 3 and modifications thereof in FIGS. 2, 4 and 5, the voltages on capacitors C2 and C3 are added to control firing of the controlled rectifiers.

While the invention hereinbefore described is effectively adapted to fulfill the objects stated, it is to be understood that we do not intend to confine our invention to the particular preferred embodiments of amplifier systems disclosed, inasmuch as they are susceptible of various further modifications without departing from the scope of the appended claims. Although only certain modifications of the invention have been shown as having one or more preamplifier stages and bias and feedback circuits connected therein, the invention contemplates use thereof in the other modifications if desired.

We claim:

1. In an electrical amplifier system for controlling electrical energization of a load:

(a) an electrical power supply source;

(b) gating-type power controlling means connected to said source and having a normal forward blocking state wherein substantially no current flows therethrough from said source and being responsive to firing voltage to switch to a conductive state to allow current flow therethrough when a forward supply voltage is being applied thereto;

(c) means effective when operated for applying firing voltage to said power controlling means to switch the latter from said forward blocking state to said conductive state;

(d) and means for operating said firing voltage applying means, comprising means responsive to application of supply voltage to said power controlling means while the latter is in said forward blocking state for developing a control voltage proportional to the integral relative to time of the forward voltage appearing across said power controlling means regardless of its wave shape and means for applying said control voltage to operate said firing voltage applying means a predetermined time interval after application of said supply voltage thereto whereby to switch said power controlling means to said conductive state.

2. The invention defined in claim 1, wherein said control voltage applying means comprises means responsive to an electrical input signal for developing a second control voltage and for algebraically adding the first control voltage and said second control voltage to afford a resultant firing signal for application to said firing voltage applying means whereby to control the length of time interval between said application of supply voltage and said switching of said power controlling means to said conductive state.

3. In a system for controlling electrical energization of a load:

(a) an electrical power supply source;

(b) a gating-type power controlling device comprising a main current conduction path having an anode and a cathode and a control current conduction path having a gate and said cathode, said device further having a forward blocking state wherein substantially no current flows in the anode-cathode path thereof although a supply voltage is applied thereto and being responsive to application of an electrical firing signal to said gate and cathode to switch to a conductive state to allow current flow in the anode-cathode path thereof while a supply voltage is being applied thereto;

(c) means connecting the anode-cathode path of said device to said supply source to afford application of a supply voltage thereto;

(d) and firing signal control means comprising means responsive to application of supply voltage to the anode-cathode path of said device while the latter is in its forward blocking state for developing a firing control signal proportional to the integral relative to time of the voltage appearing across the anode-cathode path of said device regardless of its wave shape, and (e) means responsive to said firing control signal a predetermined time interval after said application of supply voltage for applying a firing signal to the gate-cathode path of said device to cause said device to switch to its conductive state.

4. The invention defined in claim 3, wherein said firing signal control means further comprises:

(a) means responsive to an electrical input signal for developing a control signal, and (b) means for adding said control signal and said firing control signal to provide a resultant signal for application to said firing signal applying means to cause the latter sooner to respond and to apply a firing signal to the gate-cathode path of said device thereby to cause said device to switch to its conductive state before the end of said predetermined time interval.

5. The invention defined in claim 3, wherein said firing signal control means further comprises:

(a) means responsive to an electrical input signal for developing a control signal, and (b) means for subtracting said control signal from said firing control signal to provide a difference signal for application to said firing signal applying means to delay response of the latter to apply a firing signal to the gate-cathode path of said device and to cause said device to switch to its conductive state a longer time interval after said application of supply voltage.

6. The invention defined in claim 3, wherein said firing signal control means further comprises:

(a) means responsive to an adjustable input signal for developing a control signal proportional thereto; and (b) means for adding said adjustable control signal and said firing control signal to provide an adjustable resultant signal for application to said firing signal applying means thereby to vary the instant within said predetermined time interval at which said device is caused to switch to its conductive state.

7. The invention defined in claim 5, wherein:

(a) said means for developing a control signal comprises means responsive to an adjustable input signal for developing a control signal proportional thereto;

(b) and said subtracting means comprises means for subtracting said adjustable control signal from said firing control signal to provide an adjustable difference signal for application to said firing signal applying means thereby to vary the instant within said longer time interval at which said device is caused to switch to its conductive state.

8. In an amplifier system for controlling electrical energization of a load:

(a) an alternating current power supply source;

(b) a gating-type power controlling device comprising a main current conduction path for controlling current flow from said source to the load and a current conduction control path for initiating current flow in said main conduction path, said device having a forward blocking state during which substantially no current flows in said main conduction path if a supply voltage is applied thereto and being responsive to application of an electrical firing signal to said conduction control path to switch said main conduction path to a conductive state during which current flows from said source to the load during the remainder of the half-cycle of the supply voltage;

(c) and firing control means for said power controlling device comprising means responsive to application of a half-cycle of said supply voltage to said main conduction path while said device is in said forward blocking state for developing a control voltage proportional to the integral relative to time of the same shape of voltage half-cycle as that appearing across said main conduction path, and (d) means responsive to said control voltage at a predetermined adjustable point on said half-cycle for applying a firing signal to said conduction control path to initiate current flow to the load for the remainder of said half-cycle of voltage.

9. The invention defined in claim 8, wherein said firing signal applying means comprises a semi-conductor device having a negative resistance region in its voltage-current characteristic whereby said semi-conductor device is effective following response thereof to said integrated control voltage for applying said firing signal to said conduction control path of said power control device.

10. The invention defined in claim 8, wherein said firing control means comprises:

(a) a voltage integrating circuit comprising a resistor and a capacitor connected in series with one another to said main conduction path and having a time constant which is long relative to a half-cycle of said supply voltage, and (b) means responsive to the integrated voltage on said capacitor when it reaches a predetermined magnitude for applying said firing signal to said conduction control path.

11. The invention defined in claim 8, wherein said firing control means comprises:

(a) a voltage integrating circuit comprising series connected resistor and a first capacitor and having a time constant which is long relative to a half-cycle of said supply voltage;

(b) reference voltage means comprising a second capacitor, and means supplied with electrical energy from said source and being responsive to an input voltage for developing a reference voltage on said second capacitor proportional thereto and which has a constant value substantially throughout said half-cycle of the supply voltage;

(c) means connecting said second capacitor in series with said first capacitor and said resistor across said main conduction path whereby said reference voltage is added to said integrated voltage to provide a resultant voltage; and (d) wherein said firing signal applying means is connected across said first and second capacitors and is responsive to a predetermined value of said resultant voltage to discharge said first capacitor and to apply said firing signal to said conduction control path whereby increase in the magnitude of said input voltage advances on said half-cycle the point at which said firing signal is applied.

12. The invention defined in claim 11, wherein said firing control means further comprises a unidirectional discharge path connected across said first capacitor and being effective when the latter discharges for preventing charging thereof in the reverse direction by said reference voltage.

13. The invention defined in claim 10, wherein said capacitor voltage responsive means comprises a controllable semi-conductor device characterized by requiring a control voltage proportional to the supply voltage applied thereto and having a negative resistance region in its voltage-current characteristic whereby rapidly to discharge said capacitor.

14. The invention defined in claim 13, wherein said capacitor voltage responsive means further comprises means applying a supply voltage to said semi-conductor device from across said main conduction path of said power control device which supply voltage drops to zero when the latter is fired thereby to assure complete discharge of said capacitor.

15. In an amplifier system supplied from an alternating current source for supplying an adjustable alternating current output voltage to a load in response to an adjustable direct current input voltage and wherein the average magnitude of the output voltage has a linear relationship to the magnitude of the input voltage regardless of the wave form of the supply voltage:

(a) an alternating current power supply source, (b) a power amplifier comprising at least one gating-type power controlling device having a main current conduction path for controlling current flow from said source to the load and a current conduction control path for initiating current flow in said main conduction path, said device having a forward blocking state during which substantially no current flows in said main conduction path if half-cycles of supply voltage are applied thereto and being responsive to application of periodic firing voltages to said conduction control path to switch said main conduction path to conductive states to afford current flow to the load during the remaining portions of such half-cycles of the supply voltage;

(c) firing voltage control means for said power controlling device comprising means responsive to half-cycles of voltage which are in phase synchronism with those applied to said main conduction path while said device is in its forward blocking state for developing voltages proportional in magnitude to the integrated volt-seconds appearing across said main conduction path during said half-cycles, respectively, regardless of their wave shape.

(d) means responsive to a direct-current input voltage for developing a constant reference voltage proportional in magnitude to said input voltage, (e) means for algebraically adding said integrated voltages individually as they are developed to said constant reference voltage to afford respective resultant voltages, (f) and means responsive to said resultant voltages during the respective half-cycles for applying firing voltages to said conduction control path to cause said device to switch to conductive states whereby to afford output voltages to the load during the remaining portions of the respective half-cycles, and the average values of the output voltages having a linear relationship to different values of input voltage for different wave forms of supply source voltage.

16. The invention defined in claim 15, wherein said means for developing integrated voltages comprises a resistor-capacitor circuit having a time constant which is longer than the time of one-half cycle of the supply voltage.

17. The invention defined in claim 16, wherein said means for developing a constant reference voltage comprises:

(a) a reference voltage capacitor, and (b) a preamplifier for amplifying said input voltage to charge and to maintain a constant voltage on said reference voltage capacitor proportional to said input voltage and adjustable therewith.

18. The invention defined in claim 17, wherein said voltage adding means comprises means connecting said reference voltage capacitor in series with the capacitor of said resistor-capacitor circuit to add the voltages on the two capacitors.

19. The invention defined in claim 18, wherein said firing voltages applying means comprising a controllable semi-conductor device for discharging the capacitor of said resistor-capacitor circuit.

20. The invention defined in claim 19, wherein said means for developing integrated voltages further comprises a unidirectionally conductive circuit connected across the capacitor of said resistor-capacitor circuit for preventing the constant voltage on said reference voltage capacitor from charging the first mentioned capacitor in the opposite direction following each discharge thereof.

21. The invention defined in claim 19, together with a rectifying power supply circuit connected to be supplied from said source and having voltage output terminals and comprising:

(a) first means connected to said output terminals for supplying a unidirectional supply voltage to said preamplifier, (b) second means connected to said output terminals for supplying said controllable semi-conductor device with voltage half-cycles which are in phase synchronism with the voltage half-cycles supplied to the main conduction path of said power controlling device, and (c) means for preventing the voltages supplied by said first and second means from affecting one another.

22. In a firing control circuit for a solid state controlled rectifier supplied with half-cycles of positive anode voltage from a source and having a solid state control device for applying firing voltage thereto in response to charging of a capacitor under the control of an adjustable input voltage, the improvement comprising:

(a) means comprising a second capacitor and a resistor connected to the solid state controlled rectifier for developing on each half-cycle of positive anode voltage of the latter a voltage proportional to the integral relative to time of said anode voltage;

(b) and means connecting said second capacitor to the first mentioned capacitor and to said solid state control device for controlling the latter in response to the sum of the voltages on the two capacitors whereby the average values of different output voltages derived from the solid state controlled rectifier in response to adjusted input voltages have a linear relationship to the input voltages.

23. In a firing control circuit for a solid state controlled rectifier supplied with half-cycles of positive anode voltage from a source and having a solid state control device for applying firing voltage thereto when activated, the improvement comprising:

(a) means comprising a capacitor and a resistor connected to said solid state controlled rectifier for developing on each half-cycle of positive anode voltage of the latter a voltage proportional to the integral relative to time of said anode voltage;

(b) means responsive to an adjustable input voltage for developing a control voltage proportional thereto;

(c) and means connecting said control voltage developing means to said capacitor and to the solid state control device for controlling the latter in response to the difference between said integrated voltage and said control voltage.

References Cited by the Examiner

UNITED STATES PATENTS

| | | | |
|---|---|---|---|
| 2,910,641 | 10/1959 | Boyer | 321—66 |
| 3,061,747 | 10/1962 | Schlicher | 307—88.5 |
| 3,095,534 | 6/1963 | Cockrell | 323—22 |
| 3,128,396 | 6/1964 | Morgan | 307—88.5 |
| 3,146,392 | 8/1964 | Sylvan | 307—88.5 |

OTHER REFERENCES

Notes on the Application of the Silicon Unijunction Transistor, General Electric, May 1961, page 79.

LLOYD McCOLLUM, *Primary Examiner.*

MAX L. LEVY, *Examiner.*

D. L. RAE, K. W. HADLAND, H. B. KATZ, *Assistant Examiners.*